(12) United States Patent
Boguslavskiy et al.

(10) Patent No.: US 6,506,252 B2
(45) Date of Patent: Jan. 14, 2003

(54) SUSCEPTORLESS REACTOR FOR GROWING EPITAXIAL LAYERS ON WAFERS BY CHEMICAL VAPOR DEPOSITION

(75) Inventors: Vadim Boguslavskiy, Princeton, NJ (US); Alexander Gurary, Bridgewater, NJ (US)

(73) Assignee: Emcore Corporation, Somerset, NJ (US)

( * ) Notice: Subject to any disclaimer, the term of this patent is extended or adjusted under 35 U.S.C. 154(b) by 0 days.

(21) Appl. No.: 09/778,265

(22) Filed: Feb. 7, 2001

(65) Prior Publication Data

US 2002/0106826 A1 Aug. 8, 2002

(51) Int. Cl.$^7$ .............................................. C30B 35/00
(52) U.S. Cl. ......................... 117/200; 117/95; 117/98; 117/107
(58) Field of Search ............................ 117/84, 95, 98, 117/107; 427/248.1, 251

(56) References Cited

U.S. PATENT DOCUMENTS

| | | | |
|---|---|---|---|
| 4,580,522 A | 4/1986 | Fujioka et al. ............... 118/500 |
| 4,736,705 A | 4/1988 | Weyburne ................... 118/725 |
| 4,986,215 A | 1/1991 | Yamada et al. ............. 118/728 |
| 5,020,200 A | 6/1991 | Mimasaka et al. .......... 29/25.01 |
| 5,040,484 A | 8/1991 | Mears et al. ................ 118/503 |
| 5,063,031 A | 11/1991 | Sato ........................... 422/245 |
| 5,154,730 A | 10/1992 | Hodos et al. ............... 29/25.01 |
| 5,173,336 A | 12/1992 | Kennedy .................. 427/248.1 |
| 5,226,383 A | 7/1993 | Bhat ........................... 118/730 |
| 5,296,037 A | 3/1994 | Sato et al. ................ 118/723 E |
| 5,344,492 A | 9/1994 | Sato et al. .................... 118/725 |
| 5,443,648 A | 8/1995 | Ohkase ........................ 118/724 |
| 5,527,393 A | 6/1996 | Sato et al. .................... 118/725 |
| 5,688,331 A | 11/1997 | Aruga et al. ................. 118/725 |
| 5,928,427 A | 7/1999 | Hwang .................... 118/723 E |
| 5,964,942 A | * 10/1999 | Tanabe et al. ................. 117/87 |
| 5,980,706 A | 11/1999 | Bleck et al. ............... 204/297 R |
| 5,982,986 A | 11/1999 | Davenport ................... 392/418 |
| 6,026,764 A | 2/2000 | Hwang .................... 118/723 E |
| 6,086,680 A | 7/2000 | Foster et al. ................. 118/725 |
| 6,113,705 A | 9/2000 | Ohashi et al. ............... 118/730 |

* cited by examiner

*Primary Examiner*—Felisa Hiteshew
(74) *Attorney, Agent, or Firm*—Lerner, David, Littenberg, Krumholz & Mentlik, LLP

(57) ABSTRACT

The invention describes a CVD reactor on solid substrates and a related method of deposition of epitaxial layers on the wafers. In the reactor of the invention, the wafer carrier is transported between a loading position and a deposition position. In the deposition position, the wafer carrier is detachably mounted on an upper end of a rotatable spindle without an intermediate susceptor. The reactor of the invention may process a single wafer at the same time. The invention also describes several embodiments and variants of the invention. One of the variants of the invention provides a decrease in a heat drain from the wafer-supporting assembly through the spindle and a novel heating arrangement therefore. The advantages of the invention include lower reactor cycle, the lower cost and longer lifetime of the component parts, and better temperature control, among others.

29 Claims, 9 Drawing Sheets

POSITION D

POSITION L

POSITION D

POSITION L

SUSCEPTORLESS REACTOR FOR GROWING EPITAXIAL LAYERS ON WAFERS BY CHEMICAL VAPOR DEPOSITION

FIELD OF THE INVENTION

The present invention relates to making semiconductor components and more particularly relates to devices for growing epitaxial layers on substrates, such as wafers.

BACKGROUND OF THE INVENTION

Various industries employ processes to form thin layers on solid substrates. The substrates having deposited thin layers are widely used in microprocessors, electro-optical devices, communication devices and others. The processes for the deposition of the thin layers on solid substrates are especially important for the semiconductor industry. In the manufacturing of semiconductors, the coated solid substrates, such as substantially planar wafers made of silicon and silicon carbide, are used to produce semiconductor devices. After the deposition, the coated wafers are subjected to well-known further processes to form semiconductor devices such as lasers, transistors, light emitting diodes, and a variety of other devices. For example, in the production of the light-emitting diodes, the layers deposited on the wafer form the active elements of the diodes.

The materials deposited on the solid substrates include silicon carbide, gallium arsenide, complex metal oxides (e.g., $YBa_2Cu_3O_7$) and many others. The thin films of inorganic materials are typically deposited by the processes collectively known as chemical vapor deposition (CVD). It is known that the CVD processes, if properly controlled, produce thin films having organized crystal lattices. Especially important are the deposited thin films having the same crystal lattice structures as the underlying solid substrates. The layers by which such thin films grow are called the epitaxial layers.

In a typical chemical vapor deposition process, the substrate, usually a wafer, is exposed to gases inside a CVD reactor. Reactant chemicals carried by the gases are introduced over the wafer in controlled quantities and at controlled rates while the wafer is heated and usually rotated. The reactant chemicals, commonly referred to as precursors, are introduced into the CVD reactor by placing the reactant chemicals in a device known as a bubbler and then passing a carrier gas through the bubbler. The carrier gas picks up the molecules of the precursors to provide a reactant gas that is then fed into a reaction chamber of the CVD reactor. The precursors typically consist of inorganic components, which later form the epitaxial layers on the surface of the wafer (e.g., Si, Y, Nb, etc.), and organic components. Usually, the organic components are used to allow the volatilization of the precursors in the bubbler. While the inorganic components are stable to the high temperatures inside the CVD reactor, the organic components readily decompose upon heating to a sufficiently high temperature. When the reactant gas reaches the vicinity of a heated wafer, the organic components decompose, depositing the inorganic components on the surface of the wafer in the form of the epitaxial layers.

CVD reactors have various designs, including horizontal reactors in which wafers are mounted at an angle to the inflowing reactant gases; horizontal reactors with planetary rotation in which the reactant gases pass across the wafers; barrel reactors; and vertical reactors in which wafers are rotated at a relatively high speed within the reaction chamber as reactant gases are injected downwardly onto the wafers. The vertical reactors with high-speed rotation are among the most commercially important CVD reactors.

Among the desirable characteristics for any CVD reactor are heating uniformity, low reactor cycle time, good performance characteristics, longevity of the internal parts that are heated and/or rotated inside the reaction chamber, ease of temperature control and high temperature tolerance for component parts. Also important are the cost of the required component parts, ease of maintenance, energy efficiency and minimization of the heating assembly's thermal inertia. For example, if the heated components of a CVD reactor have high thermal inertia, certain reactor operations may be delayed until the heated components reach the desired temperatures. Therefore, lower thermal inertia of the heated components of the reactor increases the productivity since the throughput depends upon the reactor cycle time. Similarly, if the internal parts of the reactor that are rotated during the deposition undergo even a small degree of deformation, the reactor may exhibit excessive vibration during use, resulting in heightened maintenance requirements.

A typical prior art vertical CVD reactor is illustrated in FIG. 1. As seen from FIG. 1, a wafer 10 is placed on a wafer carrier 12, which is placed on a susceptor 14. The wafer carrier 12 is usually made from a material that is relatively inexpensive and allows good manufacturing reproducibility. The wafer carrier may have to be replaced after a certain commercially suitable number of reactor cycles. The susceptor 14 is permanently mounted and supported by a rotatable spindle 16, which enables rotation of the susceptor 14, the wafer carrier 12 and the wafer 10. The susceptor 14, the wafer carrier 12 and the wafer 10 are located in an enclosed reactor chamber 18. A heating assembly 20, which may include one or more heating filaments 22, is arranged below the susceptor 14, and heated by passing an electric current through electrodes 25. The heating assembly 20 heats the susceptor 14, the wafer carrier 12 and, ultimately, the wafer 10. The rotation of the wafer carrier 12 is intended to enhance the temperature uniformity across the deposition area, as well as the uniformity of the reactant gas introduced over the wafer 10 during the deposition. As the wafer-supporting assembly (spindle/susceptor/wafer carrier) rotates the heated wafer 10, the reactant gas is introduced into the reaction chamber 18, depositing a film on the surface of the wafer 10.

The vertical CVD reactors having both the susceptor and the wafer carrier, similar to the reactor shown in FIG. 1, enjoy a widespread and successful use for a variety of CVD applications. For example, the Enterprise and Discovery reactors, made by Emcore Corporation of Somerset, N.J., are some of the most successful CVD reactors in the commercial marketplace. However, as discovered by the inventors of the present invention, the performance of such CVD reactors may be further improved for certain CVD applications.

First, the CVD reactor having both a susceptor and a wafer carrier contains at least two thermal interfaces. Referring to FIG. 1, these are the interfaces between the heating assembly 20 and the susceptor 14, and between the susceptor 14 and the wafer carrier 12. Research by the inventors of the present invention has shown that a substantial temperature gradient exists at these interfaces. For example, the temperature of the heating assembly 20 is higher than the temperature of the susceptor 14, which, in turn, is higher than the temperature of the wafer carrier 12. Consequently, the heating assembly 20 must be heated to a substantially higher temperature than the temperature desired for the wafer 10 during the deposition. The required higher temperatures of the heating assembly lead to higher energy consumption and faster deterioration of the heating assembly's components. In addition, the typical susceptor possesses a significant heat capacity, and thus a large thermal inertia, substantially increasing the time required to heat and cool down the wafer carrier 12. This results in a longer reactor cycle and consequent reduction in the productivity of the reactor. Also, the inventors have determined that the longer reactor cycle time tends to result in a less precise and less flexible control of the wafer carrier's temperature, increasing the time necessary to stabilize the temperature of the wafer carrier prior to the deposition.

Second, in the CVD reactors similar to the reactor of FIG. 1, the susceptor 14 must withstand a large number of reactor cycles since it is permanently mounted in the reaction chamber, and typically may not be easily replaced without interrupting the reactor cycle, opening up the reactor and removing the parts that permanently attach the susceptor to the spindle, such as screws, bolts and the like. Therefore, the susceptors are usually made from highly temperature- and deformation-resistant materials, typically molybdenum. Such materials are very expensive and often exhibit a high thermal inertia.

Third, every additional interface in the wafer-supporting assembly increases the manufacturing tolerance requirements. For example, again with reference to FIG. 1, the spacing between the susceptor 14 and the wafer carrier 12 must be precise and uniform to produce the required uniform heating of the wafer. However, notwithstanding the high precision machining used in the manufacturing of the susceptors, the susceptor/wafer carrier spacing is likely to exhibit some non-uniformity due to both the over-the-time deformation of the susceptor and a certain unavoidable degree of deviation in the susceptor-to-susceptor manufacturing reproducibility. Further, a small degree of deformation of the susceptor is essentially unavoidable in the CVD reactors having both the susceptor and the wafer carrier due to the required non-uniform heating of the susceptor to produce the uniform heating of the wafer carrier. The accumulated deformation of the susceptor eventually may lead to an excessive vibration of the wafer-supporting assembly during rotation in the deposition process, and the resulting loss and destruction of coated wafers.

Fourth, in the CVD reactors with permanently mounted susceptors, the susceptor is typically rigidly attached to the spindle to minimize the vibration during the operation of the reactor. The spindle/susceptor connection is heated during the repeated operation of the reactor and sometimes becomes difficult to disassemble, complicating the maintenance and the replacement procedures.

Finally, the heavier is the wafer-supporting assembly, the larger is the mechanical inertia of the spindle. In turn, the high mechanical inertia increases the strain on the spindle-supporting assembly, reducing its lifetime.

Notwithstanding these limitations, the existing prior art CVD reactors having both a susceptor and a wafer carrier continue enjoying a successful and widespread use in the semiconductor industry.

Nevertheless, there exists a need for a CVD reactor that minimizes these limitations of the presently available CVD reactors while maintaining a high level of performance.

SUMMARY OF THE INVENTION

The present invention addresses this need by providing a novel CVD reactor in which the wafer carrier is placed on the rotatable spindle without a susceptor, and a related method of growing epitaxial layers in a CVD reactor. These novel reactors are likely to be used along with the presently available successful CVD reactors, such as the reactor shown in FIG. 1.

It has been determined by the inventors that, in the prior art CVD reactors, for example, the prior art reactor shown in FIG. 1, substantial thermal losses occur at thermal interfaces in the wafer-supporting assembly. The research by the inventors also has shown that the increase in the temperature of the heating filament required to achieve the desired wafer temperature significantly reduces the lifetime of the heating filaments.

It has also been determined by the inventors that the presence of a permanently mounted susceptor in the prior art CVD reactors makes a significant contribution to the overall thermal and mechanical inertia of the wafer-supporting assembly.

The inventors have also determined that the rotatable spindle is a source of a substantial heat drain from the wafer-supporting assembly during the deposition. This heat drain may negatively affect the heating uniformity, the energy efficiency and the lifetime of the heating filaments.

Therefore, the present invention provides a novel CVD reactor, use of which minimizes these limitations of the presently available CVD reactors, as well as the limitations described in the Background section herein.

According to one aspect of the invention, an apparatus for growing epitaxial layers on one or more wafers by chemical wafer deposition is provided, and includes a reaction chamber, a rotatable spindle, a heating means for heating the wafers and a wafer carrier for supporting and transporting the wafers between a deposition position and a loading position.

In the loading position, the wafer carrier is separated from the rotatable spindle and the wafers may be placed on the wafer carrier for subsequent transfer to the deposition position. The loading position may be located inside the reaction chamber or outside the reaction chamber. Preferably, the loading position is located outside the reaction chamber. There may be one or more of such loading positions.

In the deposition position, the wafer carrier is detachably mounted on the rotatable spindle inside the reaction chamber, permitting chemical vapor deposition of the wafers placed on the wafer carrier. Preferably, in the deposition position, the wafer carrier is in direct contact with the spindle. Also, preferably, when in the deposition position, the wafer carrier is centrally mounted onto the spindle and supported only by the spindle. Most preferably, the wafer carrier is retained on the spindle by the force of friction, meaning that there exist no separate retaining means for retaining the wafer carrier on the spindle in the deposition position. However, the apparatus of the present invention may also include a separate retaining means for retaining the wafer carrier in the deposition position. The separate retaining means may be integral with the rotatable spindle or separate from both the spindle and the wafer carrier.

The wafer carrier of the invention may include a top surface and a bottom surface. The top surface of the wafer carrier may include one or more cavities for placing the wafers. The bottom surface may include a central recess for detachably mounting the wafer carrier onto the spindle. The central recess extends from the bottom surface of the wafer carrier toward the top surface of the wafer carrier to a recess end point. Preferably, the central recess does not reach the top surface of the wafer carrier and therefore the recess end point lies at a lower elevation than the top surface of the wafer carrier.

The rotatable spindle includes an upper end for mounting the wafer carrier inside the reaction chamber. In the deposition position, the upper end of the spindle is inserted into the central recess of the bottom surface of the wafer carrier. Preferably, to improve the rotational stability of the wafer carrier, the spindle supports the wafer carrier above the wafer carrier's center of gravity.

The apparatus of the invention may also include a mechanical means for transporting the wafer carrier between the deposition position and the loading position. The heating means of the apparatus of the invention may include one or more radiant heating elements. The apparatus of the invention may be used to process a single wafer or a plurality of wafers.

According to another aspect of the present invention, an apparatus for growing epitaxial layers on one or more wafers by chemical vapor deposition is provided; the apparatus including a reaction chamber, a rotatable spindle having an upper end located inside the reaction chamber, a wafer carrier and a radiant heating element disposed under the wafer carrier. The wafer carrier provides a support and transports the wafers. During the deposition, the wafer carrier is centrally and detachably mounted on the upper end of the spindle, where it is in a contact with the spindle. The wafer carrier is mounted in a manner that allows it to be readily removed from the upper end of the spindle. After the deposition is complete or at any other time, the wafer carrier may be removed from the upper end of the spindle and transported to a position for loading or unloading wafers. There may be one or a plurality of such loading positions. The loading position may be located inside the reaction chamber or outside the reaction chamber. Preferably, the wafer carrier is in a direct contact with the upper end of the spindle and has a top surface that includes one or a plurality of cavities for supporting a plurality of wafers. Therefore, either a single wafer or a plurality of wafers may be deposited in the reactor of the invention at the same time. The wafer carrier is transported between the position mounted onto the upper end of the spindle and the loading position by mechanical means, typically a robotic arm.

In a preferred embodiment of this aspect of the invention, the bottom surface of the wafer carrier includes a central recess, which extends upward from the bottom surface in a direction of the top surface of the wafer carrier, terminating in a recess end point. The central recess does not reach the top surface of the wafer carrier. Therefore, the recess end point is located at a lower elevation than the top surface of the wafer carrier. When the wafer carrier is mounted onto the upper end of the spindle, the upper end of the spindle is inserted into the central recess in the bottom surface of the wafer carrier. The insertion provides a point of conduct between the spindle and the wafer carrier, allowing the wafer carrier to be supported by the spindle. To improve the rotational stability of the wafer carrier, the point of contact between the spindle and the wafer carrier having the highest elevation is located above the center of gravity of the wafer carrier.

In the most preferred embodiment of this aspect of the invention, the wafer carrier has a substantially round shape. In this embodiment, the top surface and the bottom surface of the wafer carrier are substantially parallel to each other. Of course, the top surface of the wafer carrier may include cavities for placing the wafers, and the bottom surface of the wafer carrier includes a recess for mounting the wafer carrier onto the upper end of the spindle, and other indentations or raised features are not excluded on either the top surface or the bottom surface of the wafer carrier.

The spindle according to this embodiment of the invention has a substantially cylindrical shape and an axis of rotation. The bottom surface of the wafer carrier, when mounted on the spindle, is substantially perpendicular to the axis of rotation of the spindle. The upper end of the spindle preferably terminates in a substantially flat top surface, which is also substantially perpendicular to the axis of rotation of the spindle. Preferably, the upper end of the spindle narrows toward the substantially flat top surface of the spindle. Therefore, the narrow portion of the upper end of the spindle is located near the substantially flat top surface of the spindle, and the wide portion of the spindle is located distal from the substantially flat top surface of the spindle.

As has been stated, the spindle is a source of a significant heat drain from the wafer-supporting assembly. The present invention provides the novel way of reducing this heat drain. To this end, in a preferred embodiment, the spindle has a cavity extending vertically downward from the substantially flat top surface of the upper end of the spindle to a cavity end point, which is disposed at a predetermined depth. The cavity in the spindle has a substantially cylindrical shape and is substantially coaxial with the spindle. The predetermined depth of the cavity in the spindle is preferably from about 3 to about 4 spindle diameters. This hollow construction of the upper end of the spindle allows the reduction of the heat drain from the wafer-supporting assembly.

To further reduce the heat drain, a specific arrangement of the radiant heating elements is provided. In this arrangement, the radiant heating element includes a first radiant heating element that is substantially coaxial with the rotatable spindle and has a top surface proximal to the bottom surface of the wafer carrier, an internal circumference and an external circumference. The internal circumference of the first radiant heating element defines a round opening around the spindle. This arrangement of the radiant heating elements of the invention may also include a second radiant heating element substantially coaxial with the first radiant heating element and the spindle, and located between the first radiant heating element and the spindle. The second radiant heating element defines an external circumference, the radius of which is smaller than the radius of the internal circumference of the first radiant heating element. Most preferably, the top surface of the second radiant heating element is located at substantially the same elevation as the top surface of the first radiant heating element, and the bottom surface of the second radiant heating element is located at the same elevation as the cavity end point of the rotatable spindle. The second radiant heating element allows heating of the upper end of the spindle, which along with the hollow construction of the upper end of the spindle reduces the heat drain from the wafer-supporting assembly. The reactor of the invention may also include a radiant heating shield.

According to yet another aspect of the invention, a method of growing epitaxial layers on one or more wafers by chemical wafer deposition is provided. According to the method of the invention, the chemical wafer deposition is carried out in a reactor chamber that includes a rotatable spindle having an upper end disposed inside the reaction chamber. To carry out the deposition, the method includes a) providing a wafer carrier having a surface for retaining one or more wafers;

b) placing one or more wafers on the surface of the wafer carrier in a loading position, in which the wafer carrier is separated from the spindle;

c) transporting the wafer carrier towards the spindle;

d) detachably mounting the wafer carrier on the upper end of the spindle for rotation therewith; and e) rotating the spindle and the wafer carrier located thereon while introducing one or more reactants to the reaction chamber and heating the wafer carrier.

Preferably, the method of the invention further includes removing the wafer carrier from the upper end of the spindle to unload the wafers. The step of detachably mounting the wafer carrier may include directly mounting the wafer carrier, and/or centrally mounting the wafer carrier on the upper end of the spindle. Preferably, the wafer carrier is mounted on the upper end of the spindle above the wafer carrier's center of gravity and retained therein only by a force of friction. Preferably, the loading position is located outside the reaction chamber.

DESCRIPTION OF THE DRAWINGS

A more accurate appreciation of the subject matter of the present invention and the various advantages thereof can be realized by reference to the following detailed description, which makes reference to the accompanying drawings in which.

DETAILED DESCRIPTION OF THE INVENTION

Figure 2:
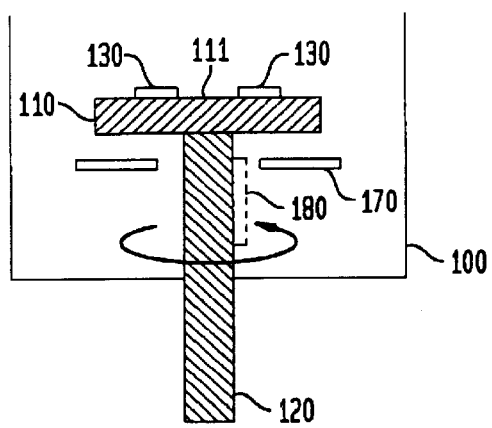
FIG. 2 is a highly schematic front cross-sectional view of a wafer-supporting assembly of the present invention, showing that the wafer carrier may be transported between the loading position and the deposition position, where it is placed on the spindle without a susceptor.
Figure 2:
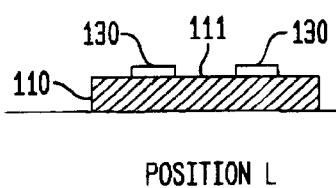
Figure 2:
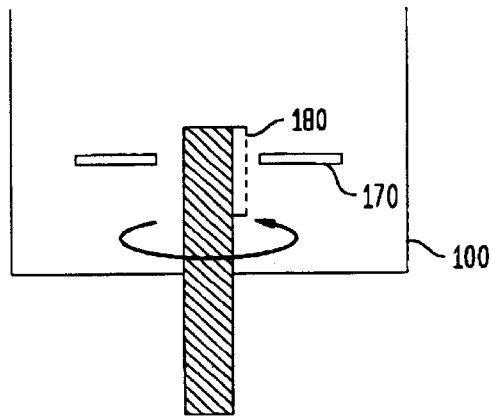

The general concept of the invention is shown in FIG. 2. The reactor of the invention includes a reaction chamber 100, a wafer carrier 110, a rotatable spindle 120 and heating means 170. The wafer carrier 110 is transported between a loading position L and a deposition position D. In the position L, the wafer carrier 110 is separated from the spindle 120. In the position D, the wafer carrier 110 is mounted on the rotatable spindle 120. Preferably, the wafer carrier 110 is mounted on an upper end 180 of the spindle 120.

According to the invention, in position D, the wafer carrier is mounted in any manner that would allow it to be readily separated from the spindle 120 in the normal course of operating the reactor of the invention during the reactor cycle. Such manner of mounting the wafer carrier 110 excludes such means of attaching the wafer carrier 110 to the spindle 120 as screws, bolts and the like, the use of which would necessitate the opening of the reactor and the removal of such parts or pieces that would permanently attach the wafer carrier 110 to the spindle 120. Preferably, in position D, the wafer carrier 110 is retained on the spindle 120 only by a force of friction, with no separate retaining means.

Figure 1:
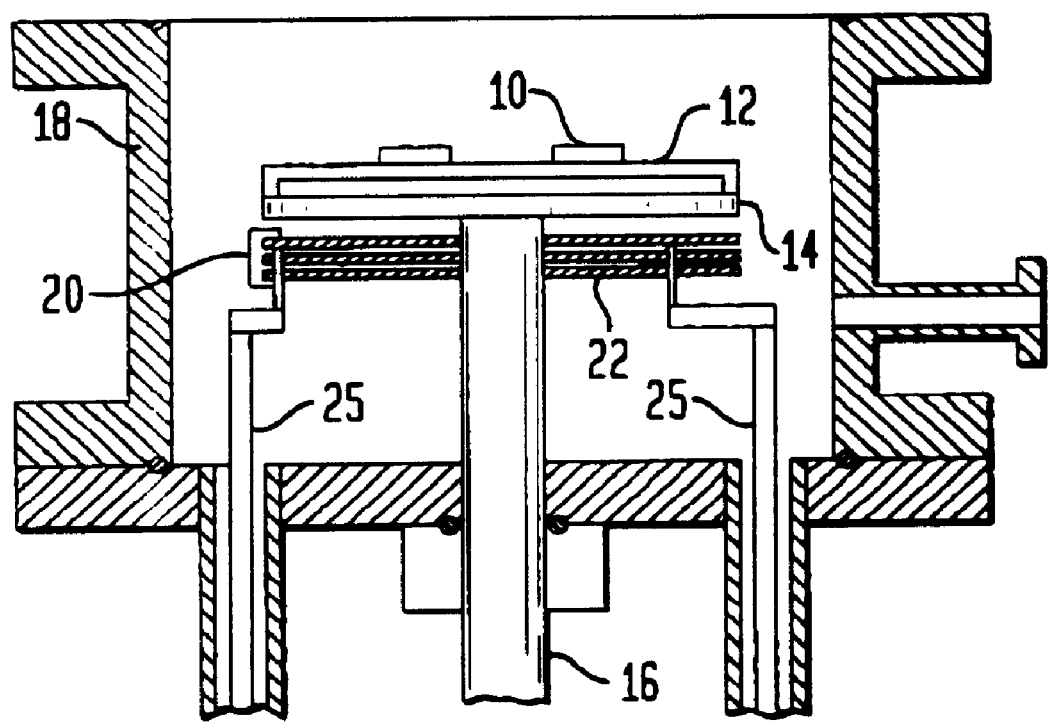
FIG. 1 is a highly schematic front cross-sectional view of a CVD reactor of the prior art.

In contrast to the prior art CVD reactor shown in FIG. 1, the reactor of the present invention does not include a susceptor. Preferably, the wafer carrier 110 is directly mounted onto the spindle 120, i.e., in the position D, a direct contact is established between the wafer carrier 110 and the spindle 120. The invention does not exclude the possibility that intermediate elements may be present between the spindle 120 and the wafer carrier 110, for example the elements that would facilitate retaining the wafer carrier 110 on the spindle 120, such as rings, retainers and the like, as long as these intermediate elements do not interfere with the removal or detachment of the wafer carrier from the position D in the normal course of the operation of the reactor.

In the position L, wafers 130 are loaded onto the wafer carrier 110 prior to the transfer of the wafer carrier 110 and the wafer 130 to the reaction chamber 100. The loading position L may be located inside or outside of the reaction chamber 100. Although only one position L is shown in FIG. 2, there may be one or more such positions.

The wafer carrier 110 may include a top surface 111 for placing wafers. The reactor of the invention may be used for coating a single wafer or a plurality of wafers. Accordingly, the top surface 111 of the wafer carrier 110 may be adopted either for a single wafer or a plurality of wafers in any manner known in the art. Preferably, the top surface 111 has a plurality of cavities for placing a plurality of wafers 130.

Figure 3A:
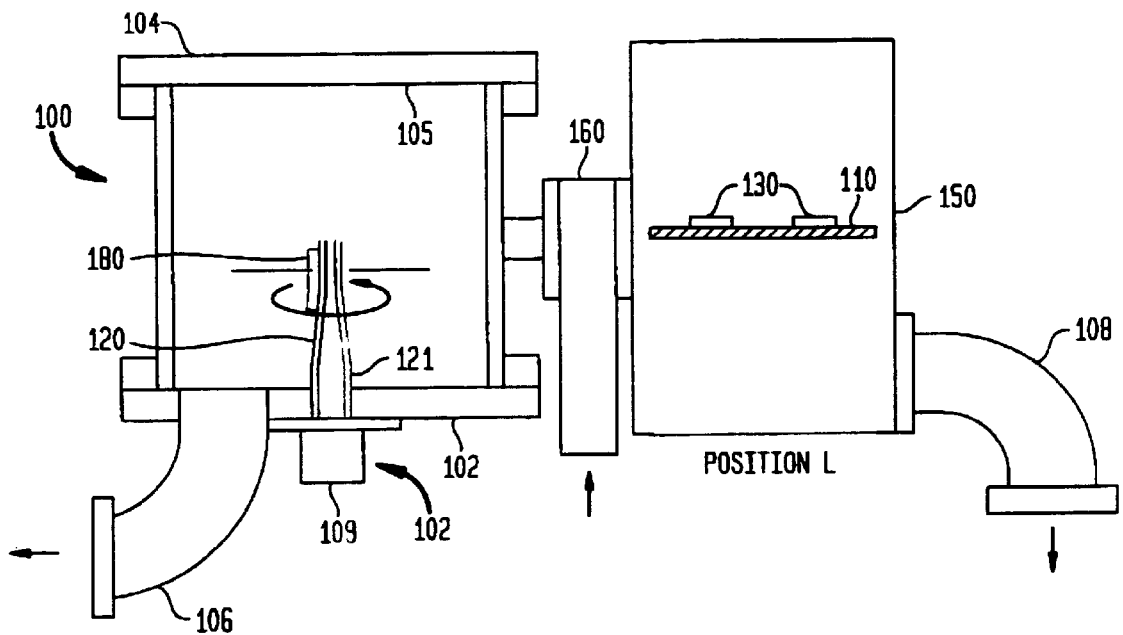
FIGS. 3A and 3B are highly schematic views of an apparatus of the present invention, showing that the wafer carrier may be transferred between a loading position and a deposition position through a gate valve.
Figure 3B:
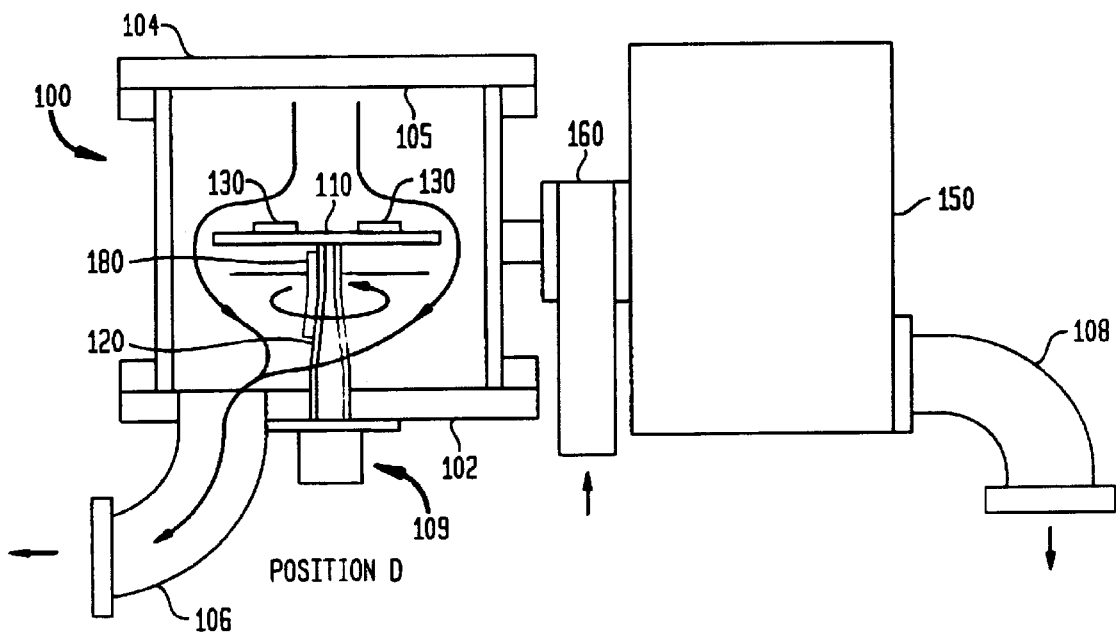

FIGS. 3A and 3B show an example of the transporting operation for the wafer carrier 110. As can be seen with reference to FIG. 3A, the loading position L for the wafer carrier 110 is located in a separate loading chamber 150 that is connected to reaction chamber 100 by a gate valve 160. The loading chamber 150 has an exhaust opening 108 that allows for separate ventilation of the loading chamber 150 without interrupting the reactor cycle. In position L, the wafer carrier 110 is loaded with uncoated wafers 130. Thereafter, the wafer carrier 110 is transported through the gate valve 160 to the reaction chamber 100.

The reaction chamber 100 may include a top flange 104 and a bottom plate 102. The spindle 120 is inserted through an opening in the base plate 102 so that the upper end 180 of the spindle 120 is inside the reaction chamber 100. The spindle 120 may be connected to rotating means 109, such as an electric motor. The reaction chamber 100 may also include an exhaust opening 106 and other elements known in the art.

As shown in FIG. 3B, in the deposition position D, the wafer carrier 110 with uncoated wafers 130 is mounted on the upper end 180 of the spindle 120, and may be rotated together with the spindle 120 during the operation of the reactor. The precursor chemicals then may be supplied to the reaction chamber 100 through the top flange 104, while the wafer carrier 110 and the wafers 130 are rotated by the spindle 120 and heated by the heating means 140. Preferably, only the spindle 120 supports the wafer carrier 110 in the position D.

After the deposition is complete, the wafer carrier 110 is transported back to the position L to unload the coated wafers and to load new uncoated wafers for subsequent transfer to the position D in the reaction chamber 100. This reactor cycle may be repeated to process a larger quantity of wafers.

The wafer carrier 110 may be transported between the positions D and L in any manner known in the art. For example, the reactor of the invention may include a mechanical means for the transfer, for example, a robotic arm or an autoloader. For example, the suitable mechanical means for transferring the wafer carrier of the present invention is described in co-assigned U.S. Pat. No. 6,001,183, which is incorporated herein by reference in its entirety.

Preferably, the wafer carrier 110 has a round or a rectangular shape; most preferably the wafer carrier 110 has a round shape. The wafer carrier may be made from any suitable material capable of withstanding the high temperatures inside the reaction chamber of the CVD reactor, such as graphite or molybdenum. Of course, cost considerations may affect the choice of the suitable material. The absence of the susceptor/wafer carrier interface, as explained above, broadens the choice of the suitable materials to include less expensive alternatives.

The heating means 140 preferably include one or more radiant heating elements. Use of a plurality of radiant heating elements permits multi-zone heating of the wafer carrier 110, better temperature control and coating uniformity. The radiant heating elements may be arranged in any manner known to those skilled in the art. The preferred arrangement will be shown with reference to the specific embodiments of he invention.

The CVD reactor of the present invention has a number of important advantages. The absence of a permanently mounted susceptor reduces the thermal inertia of the wafer-supporting assembly, resulting in a reduction of the reactor cycle time and a better control over the wafer temperatures. Also, the elimination of one of the thermal interfaces present in the prior art reactors (i.e., heating element/susceptor interface) reduces the temperature gradient between the heating element or elements and the wafer, increasing the energy efficiency of the reactor and the lifetime of the heating elements. Further, the lower weight of the wafer-supporting assembly reduces its mechanical inertia and therefore the strain on the spindle. The elimination of the contact between the susceptor and the wafer carrier that requires high precision machining and still may exhibit some non-uniformity results in lower manufacturing tolerance requirements and better wafer-to-wafer temperature uniformity. For the same reasons, the wafer carrier of the present invention may be made of less expensive materials, reducing the overall cost of the reactor. Also, the possibility of the vibration of the wafer-supporting assembly is minimized due to the good rotational stability of the wafer carrier of the invention. For the same reasons, the lower vibration leads to lower losses of the coated wafers. These and other advantages of the invention will be explained with reference to the specific embodiments and variants of the invention.

For the purpose of illustration, the present invention will be described with reference to the specific embodiments. It should be understood that these embodiments are not limiting and the present invention encompasses any subject matter that is within the scope of the appended claims.

Figure 4:
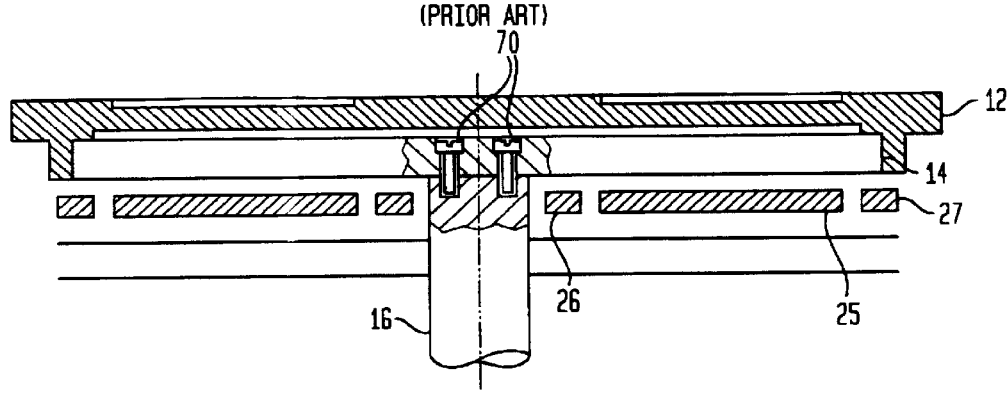
FIG. 4 is a highly schematic diagram of the wafer-supporting assembly of the prior art, showing a susceptor permanently attached to the upper end of the spindle, the wafer carrier, the heating element and the radiant heating shield.

FIG. 4 shows a wafer-supporting assembly of the prior art. The susceptor 14 is permanently mounted onto the spindle 16 by screws 70. During the deposition, the wafer carrier 12 is placed onto the susceptor 14. The heating arrangement may include a primary heating element 25 and secondary heating elements 26 and 27. As described above, the inventors have discovered that the presence of the susceptor 14 and the resulting heating element/susceptor and susceptor wafer carrier interfaces effect the performance of the reactor.

Figure 5A:
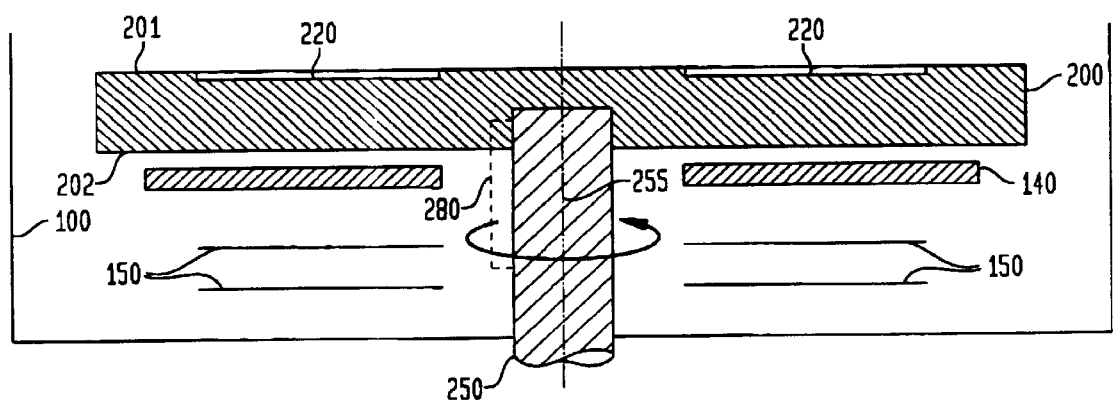
FIG. 5A is a highly schematic front cross-sectional view of the wafer-supporting assembly of the present invention, showing the wafer carrier mounted on the upper end of the spindle in the deposition position.

Therefore, all embodiments of the reactor of the invention do not include a permanently mounted susceptor. FIGS. 5A, 5B, 5C and 5D show a variant of the wafer-supporting assembly for an embodiment of the reactor of the invention. As seen from FIG. 5A, the reactor includes the reaction chamber 100, a spindle 250 having an upper end 280 located inside the reaction chamber 100, a wafer carrier 200 and a radiant heating element 140. FIG. 5A shows the wafer carrier 200 in the deposition position.

Figure 5B:
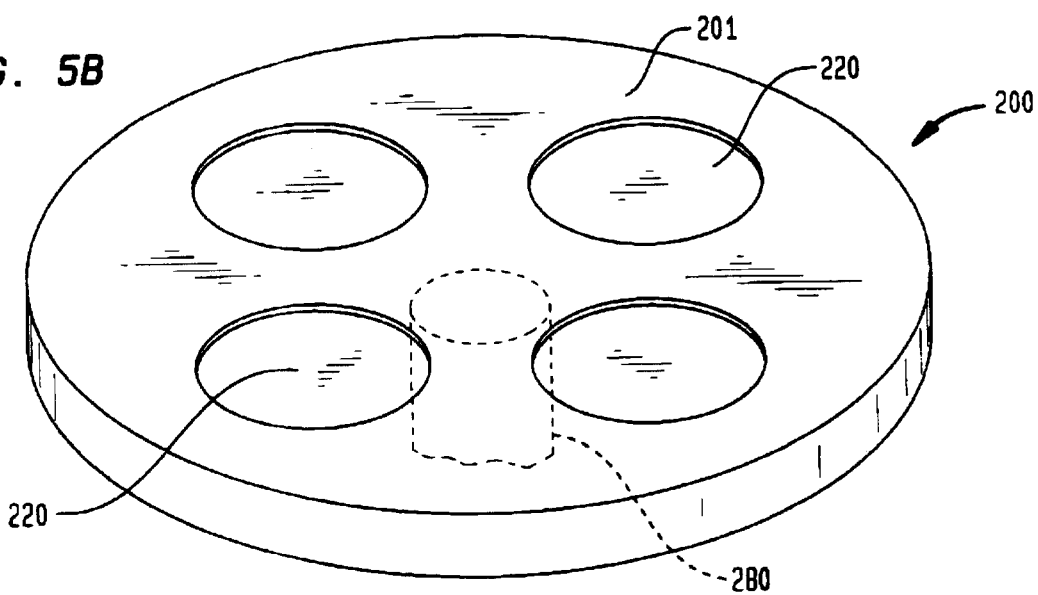
FIG. 5B is a top perspective view of the wafer carrier of the variant of the invention shown in FIG. 5A.

The wafer carrier 200 has a top surface 201 and a bottom surface 202. The top surface 201 includes cavities 220 for placing wafers. As shown in FIG. 5B, the wafer carrier 200 has a round shape. The bottom surface 202 is parallel to the top surface 201, except in the regions defined by the cavities 220. As seen from FIG. 5D, the bottom surface 202 of the wafer carrier 200 includes a central recess 290. The central recess 290 extends upwards from the bottom surface 202 and terminates in a flat surface 291 surrounded by recess walls 292.

Figure 5C:
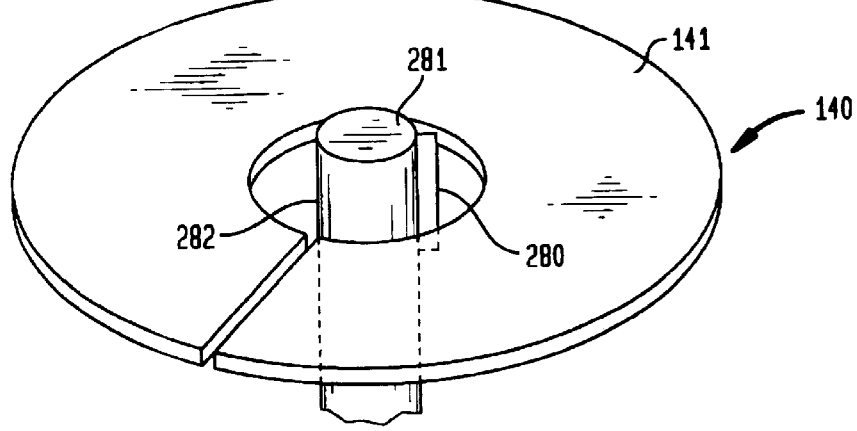
FIG. 5C is a top perspective view of the wafer-supporting assembly of the variant of invention shown in FIGS. 5A and 5B, with the wafer carrier being in the loading position, in which the wafer carrier is removed from the spindle, showing the upper end of the spindle and the primary heating element.
Figure 5D:
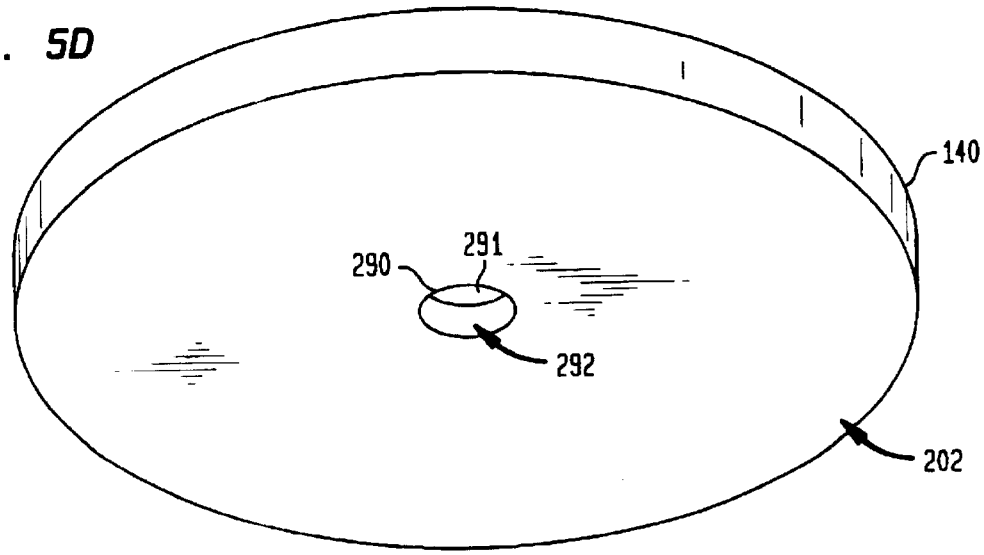
FIG. 5D is an elevated bottom view of the wafer carrier of the variant of the invention shown in FIGS. 5A–5C.

The spindle 250 has a cylindrical shape and an axis of rotation 255. FIG. 5C shows the upper end 280 of the spindle 250 and the radiant heating element 140 when the wafer carrier 200 is separated from the spindle, such as when the wafer carrier is in the loading position L. As seen from FIG. 5C, the upper end 280 of the spindle 250 has spindle walls 282 that terminate in a top surface 281. FIG. 5C also shows the radiant heating element 140 having a top surface 141. The radiant heating element 140 is positioned in such a manner that, during the deposition, the top surface 141 is capable of heating the wafer carrier 200, which is mounted on the upper end 280 of the spindle 250 above the radiant heating element 140.

In the deposition position D, the upper end 280 of the spindle 250 is inserted in the central recess 290 of the wafer carrier 200. The flat surface 281 of the spindle 250 lies adjacent to the flat surface 291 of the recess 290, while the spindle wall 282 is in a direct contact with the recess wall 292. Upon a complete insertion, the flat surface 281 of the upper end 280 of the spindle 250 is placed in a direct contact with the flat surface 291 of the central recess 290. Preferably, the highest point or points of contact between the wafer carrier 200 and spindle 250 (in this variant of the invention, the area of contact between the surfaces 291 and 281) lies above the center of gravity of the wafer carrier 200, contributing to the rotational stability of the wafer carrier.

The insertion of the upper end 280 of the spindle 250 into the recess 290 creates a friction fit between the spindle wall 282 and the recess wall 292 that allows the rotation of the wafer carrier 200 by the spindle 250 without separate retaining means. During the deposition, the spindle is rotated thereby rotating the wafer carrier 200 and the wafers placed in the cavities 220. Retaining the wafer carrier on the spindle only by friction allow the minimization of the mechanical inertia of the carrier-spindle assembly and the resulting decrease of the strain on the spindle. If the spindle 250 have to be suddenly stopped and the force of inertia exerted upon the wafer carrier exceeds the force of friction between the upper end 280 of the spindle 250, the wafer carrier 200 may rotate independently from the spindle, reducing the strain on the spindle.

Figure 9A:
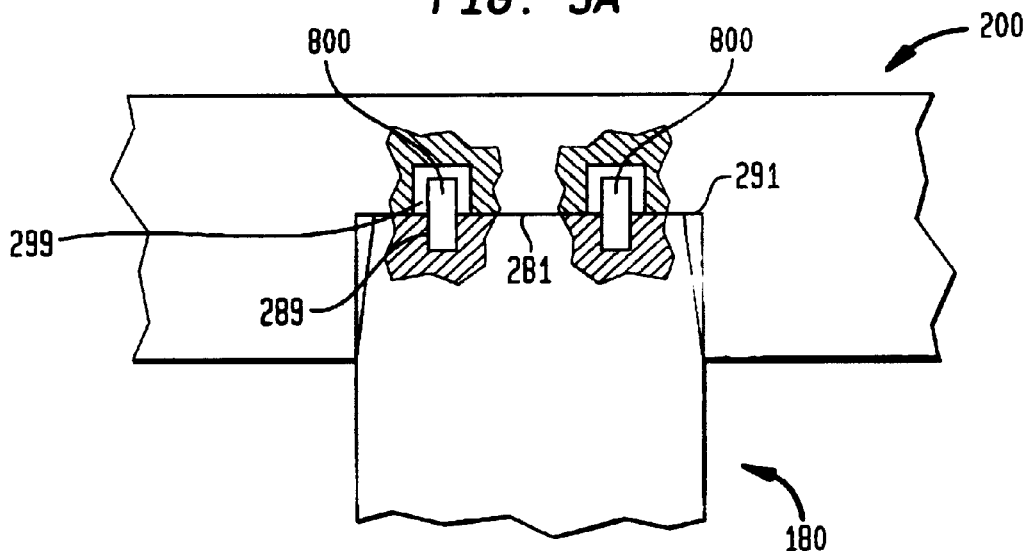
FIGS. 9A, 9B and 9C show possible variants of the retaining means of the invention for retaining the wafer carrier on the upper end of the spindle in the deposition position.
Figure 9B:
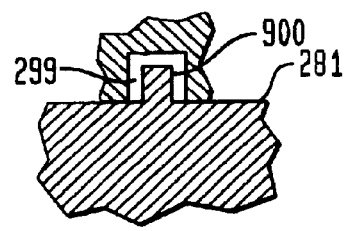
Figure 9C:
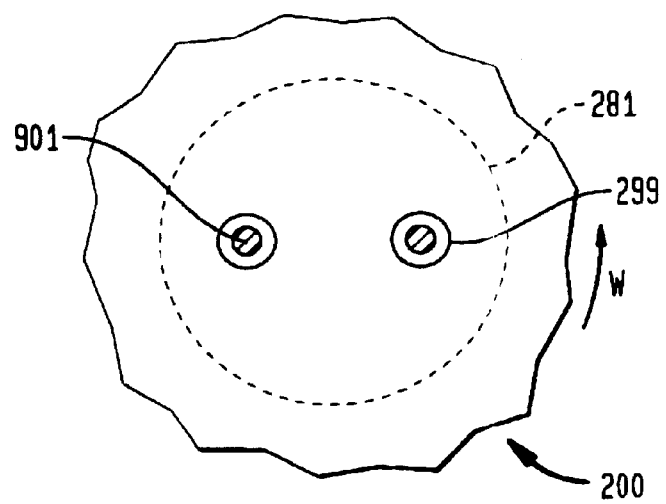

However, the present invention also contemplates the use of a separate retaining means in the wafer-supporting assembly. Examples of such separate retaining means are shown in FIGS. 9A, 9B and 9C. As shown in FIG. 9A, the upper end 280 of the spindle 250 may include indentations 289, extending vertically downward from the flat surface 281. The wafer carrier 200 may have matching indentations 299 in the flat surface 291 of the recess 290. The indentations 299 extend vertically upwards from the flat surface 291. Fingers 800 may then be inserted in the indentations 289 and 299, tying the wafer carrier 200 and the spindle 250 together. Alternatively, as seen in FIG. 9B, the flat surface 281 of the upper end 280 of the spindle 250 may include raised features 900, which are integral with the upper end of the spindle. In the deposition position of the wafer carrier 200, the features 900 are inserted into matching indentations 299 in the flat surface 291 of the recess 290. Preferably, as seen from FIG. 9C, the retaining means include two fingers 800 or two raised features 900, and the corresponding number of matching indentations.

Figure 6A:
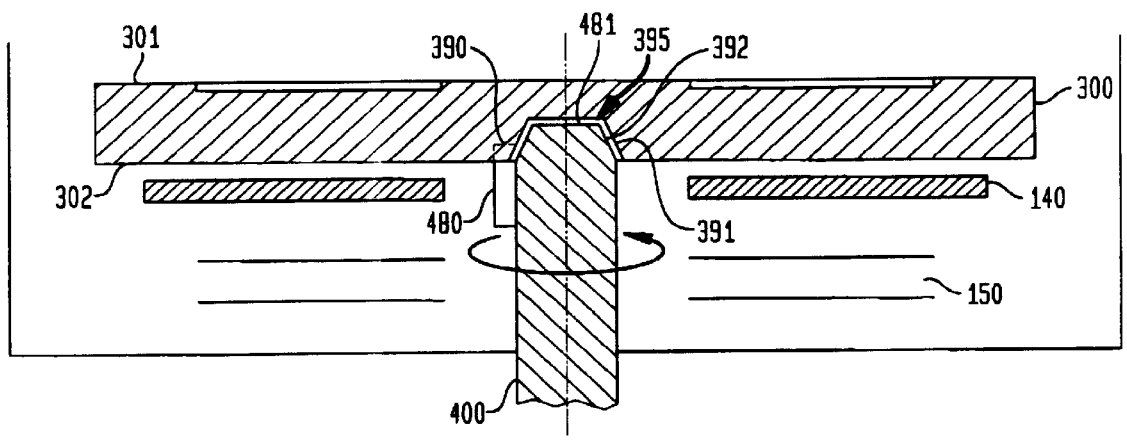
FIG. 6A is a highly schematic front cross-sectional view of another variant of the invention.
Figure 6B:
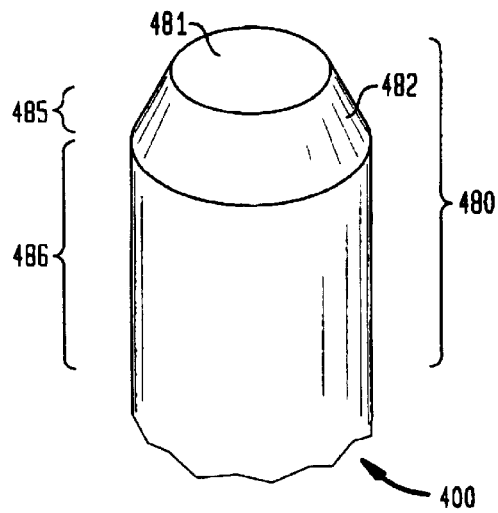
FIG. 6B is a top perspective top view of the spindle of the variant of the invention shown in FIG. 6A.

Another variant of the wafer-supporting assembly is shown in FIGS. 6A and 6B. This variant is similar to the variant shown in FIGS. 5A–5D, with the exception of the wafer carrier/spindle relationship in the deposition position of the wafer carrier. According to this variant of the invention, a bottom surface 302 of wafer carrier 300 has a central recess 390. The recess 390 includes a narrow portion 392 and a broad portion 391. The narrow portion 392 terminates in a flat surface 395.

As seen in FIG. 6B, an upper end 480 of the spindle 400 includes a narrow portion 485 and a broad portion 486. The narrow portion 485, that includes the spindle wall 482, terminates in a top surface 481. In the deposition position, the top surface 481 of the upper end 480 of the spindle 400 is inserted into the central recess 390 of the wafer carrier 300. The difference between this variant of the wafer-supporting assembly and the previously described variant shown in FIGS. 5A–5D is principally in the shape of the central recess 390 and the upper end 480 of the spindle 400. Similarly to the variant of the invention shown in FIGS. 5A–5D, the wafer carrier 300 is retained on the upper end 480 of the spindle 400 by the force of friction. In mounting the wafer carrier 300 in the deposition position, the upper end 480 of the spindle 400 is inserted into the central recess 390 until there is a tight fit between the spindle wall 482 and the walls of the recess 390, which creates a force of friction for retaining the wafer carrier 300 in the deposition position. It also should be noted that the top surface 481 of the spindle 400 may or may not be in a direct contact with the surface 395 of the central recess 390, as will be shown below with reference to FIG. 7A describing another, but similar variant of the wafer-supporting assembly.

As explained above, the spindle itself is often a source of a heat drain from the wafer-supporting assembly. Where a wafer carrier for processing a single wafer is mounted on a rotatable spindle, the presence of the spindle has an effect on the temperature of the wafers. The wafer carrier is centrally mounted on the spindle so that the central region of the single wafer cavity on the top surface of the wafer carrier overlies the rotatable spindle. As the spindle draws heat away from the region of the wafer carrier in the central region, the temperature gradient created in the wafer carrier is transferred to the overlying single wafer cavity, resulting in a non-uniform temperature distribution across the surface of the wafer being processed. It is a lesser problem where a plurality of wafers are processed simultaneously using a single wafer carrier since, as can be seen from FIG. 5B, such wafer carrier includes a plurality of wafer cavities arranged symmetrically around the center of the wafer carrier, and no one wafer cavity overlies the axial center of the wafer carrier where the spindle is connected. Hence, the fact that the spindle draws heat away from the center portion of the wafer carrier interferes with the temperature of the wafers positioned in the wafer cavities to a lesser degree than with a single wafer processing. However, even with wafer carriers such as shown in FIG. 5B, the heat drain may create some heating non-uniformity across the wafer carrier's surface. This non-uniformity may be increased for the reactors of the present invention since the wafer carrier is placed on the upper end of the spindle without an intermediate susceptor that is present in the prior art reactors.

Figure 7A:
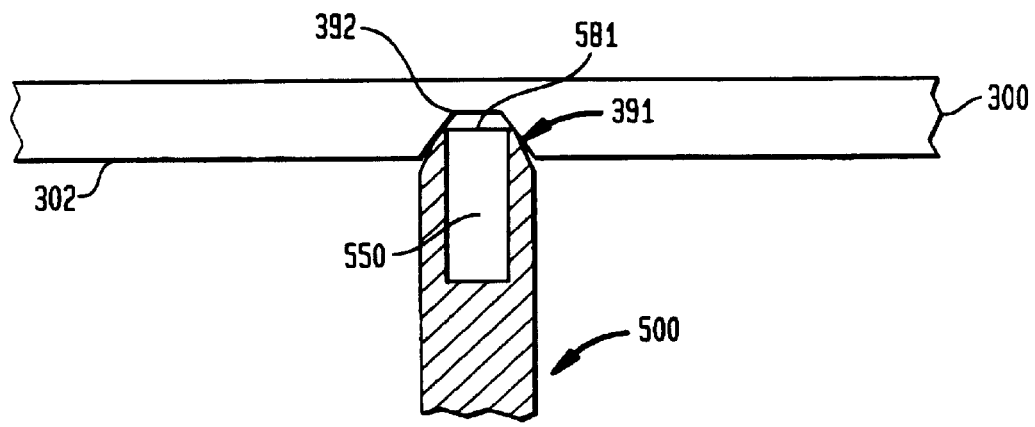
FIG. 7A is a highly schematic cross-sectional view of the wafer-supporting assembly of another variant of the invention, showing a cavity in the upper end of the spindle for reducing the heat drain from the wafer-supporting assembly through the spindle.
Figure 7B:
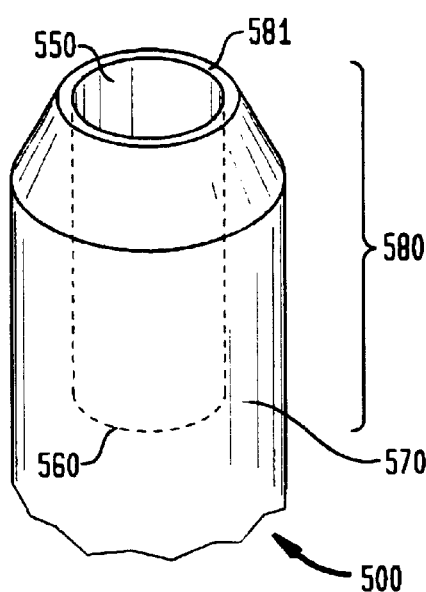
FIG. 7B is a top perspective view of an upper end of the spindle according to the variant shown in FIG. 7A.
Figure 7C:
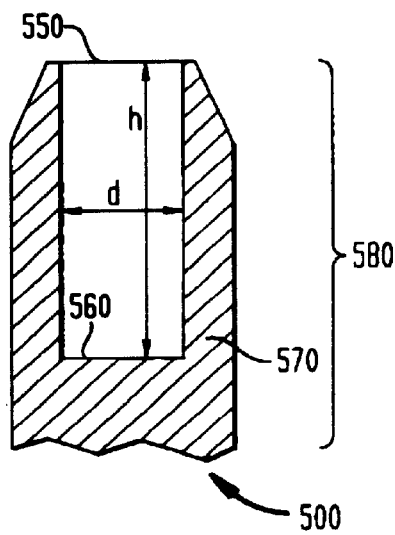
FIG. 7C is a highly schematic front cross-sectional view of the spindle of the variant of the invention shown in FIGS. 7A and 7B.

Therefore, the present invention provides a variant of the wafer-supporting assembly that minimizes the heat drain through the rotatable spindle. This variant is shown in FIGS. 7A, 7B, 7C and 7D. The upper end 580 of the spindle 500 includes a cavity 550, extending downwards from the top surface 581. The cavity 550 is substantially coaxial with the spindle 500. FIG. 7B shows the upper end 580 of the spindle 500 without the wafer carrier 300. The cavity 550 extends to a cavity end point 570, which may constitute a flat surface 560 or otherwise. The depth h of the cavity 550 is preferably equal to from about 3 to about 4 of the spindle cavity diameters d (FIG. 7C). As seen from FIGS. 7B and 7C, the upper end 580 of the spindle 500 has a hollow construction, and the contact area between the top surface 581 and the surfaces of the recess 390 is minimized. This reduces the heat drain from the wafer carrier 300 through the spindle 500. Further reduction to the heat drain is obtained if the flat surface 395 of the recess 390 is not in contact with the top surface 581 of the spindle 500, as shown in FIG. 7A.

Figure 7D:
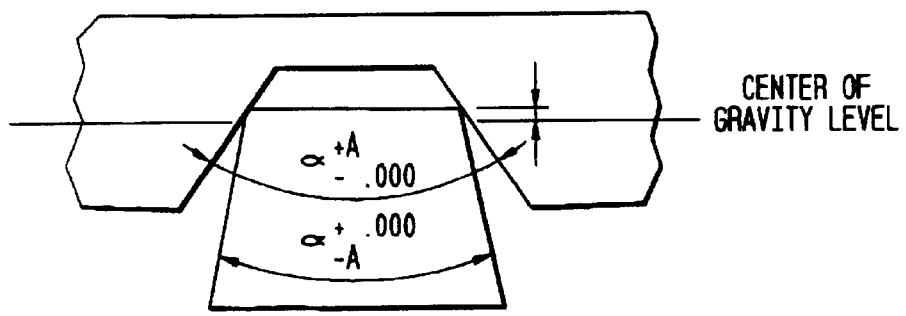
FIG. 7D is a highly schematic front cross-sectional view of the relationship between the spindle and the wafer carrier of the variant of the invention shown in FIGS. 7A–7C.

FIG. 7D shows a preferred relationship between the spindle and the wafer carrier for this variant of the invention.

As stated earlier, the point of contact between the wafer carrier and the spindle is preferably above the center of gravity of the wafer carrier. As seen from FIG. 7D, this arrangement may be achieved via an adjustment in the manufacturing tolerances for the upper end of the spindle and the central recess of the wafer carrier. In general, it is difficult to avoid the presence of a small degree of deviation from the intended angle α (FIG. 7D). However, the bias of the manufacturing tolerance A may be manipulated. Thus, preferably, in the manufacturing process, the angle a for the central recess of the wafer carrier and for the upper end of the spindle is set identically. However, for the central recess of the wafer carrier, the manufacturing tolerance A is given a positive bias, whereas for the upper end of the spindle, the manufacturing tolerance A is given a negative bias. Together with the appropriate choice of the depth for the central recess of the wafer carrier, this minimizes the contact between the wafer carrier and the spindle, and allows the point of contact between the wafer carrier and the spindle to be above the center of gravity of the wafer carrier.

Figure 8A:
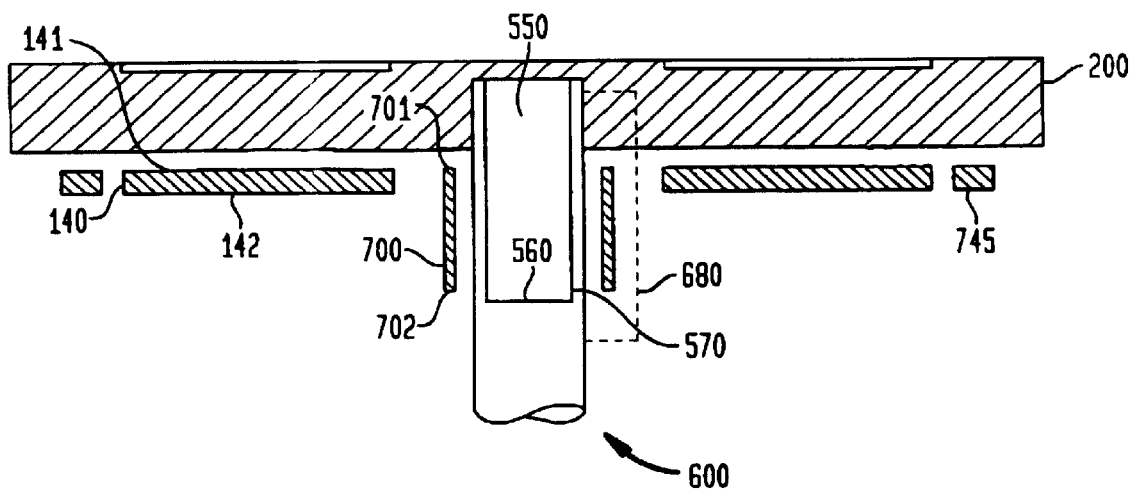
FIG. 8A is a highly schematic front cross-sectional view of the wafer-supporting assembly of the invention showing a novel arrangement of the spindle and the radiant heating elements, use of produces a decrease in the heat drain from the wafer-supporting assembly through the spindle.
Figure 8B:
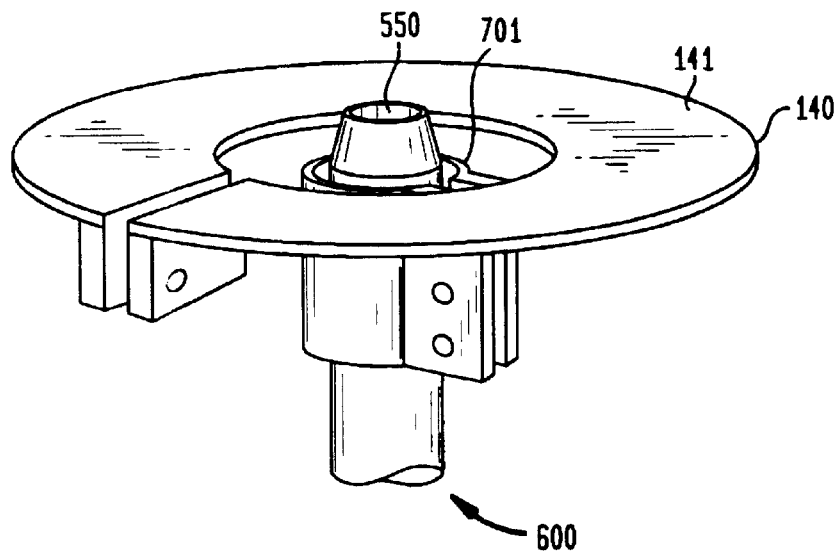
FIG. 8B is a top perspective top view of the wafer-supporting assembly of the invention, with the wafer carrier being in the loading position, showing the spindle/heating element arrangement for a variant of the invention shown in FIGS. 7A–7C.

To yet further reduce the heat drain through the spindle, the reactors of the invention may be equipped with a novel arrangement of radiant heating elements shown in FIGS. 8A and 8B. FIG. 8A shows a primary radiant heating element 140 and a secondary heating element 700. The secondary heating element 700 has a top surface 701 and a bottom surface 702, and is shaped around the hollow upper end 680 of the spindle 600. The bottom surface 702 of the secondary heating element 700 is located at the same elevation as the endpoint 570 of the cavity 550, thereby, upon heating, creating a heat barrier against the heat drain from the wafer-supporting assembly. Thus, the hollow upper end 680 of spindle 600 is heated by the secondary heating element 700, further reducing the heat drain through the spindle. The top surface 701 of the secondary heating element 700 is located at the same elevation as the top surface 141 of the primary radiant heating element 140. As seen from FIG. 8B, the upper end 680 of the spindle 600 may be the same as the upper end of the spindle in the variant of the invention shown in FIGS. 6A and 6B.

Although the present invention has been described herein with reference to the particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A vertical apparatus for growing epitaxial layers on one or more wafers by chemical vapor deposition, said apparatus comprising:
   a) a reaction chamber;
   b) a rotatable spindle having an upper end disposed inside said reaction chamber;
   c) a wafer carrier for transporting and providing a support for said one or more wafers; said wafer carrier being centrally and detachably mounted on said upper end of said spindle and being in contact therewith at least in the course of said deposition; said wafer carrier being readily removable from said upper end of said spindle for transporting said wafer carrier to load or unload said one or more wafers; and
   d) a radiant heating element disposed under said wafer carrier for heating thereof.

2. The apparatus of claim 1, wherein said wafer carrier is in direct contact with said upper end of said rotatable spindle.

3. The apparatus of claim 2, wherein said wafer carrier has a top surface comprising a plurality of cavities for retaining a plurality of said one or more wafers.

4. The apparatus of claim 3, further comprising mechanical means for transporting said wafer carrier from said position detachably mounted on said spindle to said position for loading or unloading said one or more wafers.

5. The apparatus of claim 4, wherein said wafer carrier has a bottom surface having a central recess extending upwards from said bottom surface of said wafer carrier in a direction toward said top surface of said wafer carrier to a recess end point, said recess end point of said central recess located at a lower elevation than said top surface of said wafer carrier;
   said upper end of said spindle being insertable into said central recess thereby providing a point of contact between said spindle and said wafer carrier, whereby said wafer carrier may be supported by said spindle.

6. The apparatus of claim 5, wherein said point of contact between said spindle and said wafer carrier is disposed above the center of gravity of said wafer carrier, whereby said wafer carrier is supported by said spindle above said center of gravity of said wafer carrier.

7. The apparatus of claim 6, wherein said wafer carrier has a substantially round shape, said top surface of said wafer carrier and said bottom surface of said wafer carrier being substantially parallel to each other.

8. The apparatus of claim 7, wherein said spindle has an axis of rotation and a substantially cylindrical shape;
   said bottom surface of said wafer carrier being substantially perpendicular to said axis of rotation of said spindle;
   said upper end of said spindle terminating in a substantially flat top surface substantially perpendicular to said axis of rotation of said spindle.

9. The apparatus of claim 8, wherein said upper end of said spindle has a wide portion disposed distal from said substantially flat top surface of said upper end of said spindle, and a narrow portion disposed proximal to and terminating in said substantially flat top surface of said upper end of said spindle;
   said spindle having a cavity extending vertically downward from said substantially flat top surface of said upper end of said spindle to a cavity end point;
   said central recess in said bottom surface of said wafer carrier having a wide portion disposed distal from said recess end point and a narrow portion disposed proximal to said recess end point;
   whereby said point of contact between said wafer carrier and said spindle is disposed proximal to said recess end point of said bottom surface of said wafer carrier.

10. The apparatus of claim 9, wherein said cavity in said spindle has a substantially cylindrical shape and defines a cavity diameter, said cavity in said spindle being substantially coaxial with said spindle;
   wherein a distance from said substantially flat top surface of said upper end of said spindle to said cavity end point is from about 3 to about 4 times greater than said cavity diameter of said cavity.

11. The apparatus of claim 10, wherein said radiant heating element comprises a first radiant heating element substantially coaxial with said rotatable spindle.

12. The apparatus of claim 11, wherein said first radiant heating element includes a top surface proximal to said bottom surface of said wafer carrier, an internal circumference, wherein said internal circumference defines a round opening.

13. The apparatus of claim 12, further comprising a second radiant heating element substantially coaxial with said first radiant heating element, said second radiant heating element defining an external circumference, wherein the radius of said internal circumference of said first radiant heating element is larger than the radius of said external circumference of said second radiant heating element.

14. The apparatus of claim 13, wherein at least part of said second radiant heating element is disposed in the same plane as said round opening defined by said internal circumference of said first radiant heating element.

15. The apparatus of claim 14, wherein said second radiant heating element includes a top surface disposed at substantially the same elevation as said top surface of said first radiant heating element, and a bottom surface disposed at substantially the same elevation as said cavity end point of said rotatable spindle.

16. The apparatus of claim 15, further comprising a radiant heating shield.

17. An apparatus for growing epitaxial layers on one or more wafers by chemical vapor deposition, said apparatus comprising:
 a) a reaction chamber;
 b) a rotatable spindle;
 c) heating means for heating said one or more wafers, said heating means disposed inside said reaction chamber; and
 d) a wafer carrier for supporting and transporting said one or more wafers, said wafer carrier being transportable between
  i. a deposition position for carrying out said chemical vapor deposition, wherein said wafer carrier is detachably mounted on said rotatable spindle for rotation therewith inside said reaction chamber; and
  ii. a loading position for loading and unloading said one or more wafers, wherein said wafer carrier is not mounted on said rotatable spindle.

18. The apparatus of claim 17, wherein, when in said deposition position, said wafer carrier is in direct contact with said spindle.

19. The apparatus of claim 18, wherein, when in said deposition position, said wafer carrier is supported only by said spindle.

20. The apparatus of claim 19, wherein, when in said deposition position, said wafer carrier is centrally mounted on said spindle.

21. The apparatus of claim 20, wherein, when in said deposition position, said wafer carrier is retained on said spindle by a force of friction.

22. The apparatus of claim 21, wherein said wafer carrier has a top surface including one or more cavities for retaining said one or more wafers, and a bottom surface having a central recess for mounting said wafer carrier on said spindle in said deposition position; said spindle having an upper end disposed inside said reaction chamber wherein said upper end of said spindle may be inserted into said central recess of said wafer carrier.

23. The apparatus of claim 22, wherein said central recess in said bottom surface of said wafer carrier extends upwards from said bottom surface toward said top surface of said wafer carrier to a recess end point disposed at a higher elevation than the center of gravity of said wafer carrier and at a lower elevation than said top surface of said wafer carrier, whereby said wafer carrier is supported by said spindle above said center of gravity of said wafer carrier.

24. The apparatus of claim 17, wherein said heating means comprises one or more radiant heating elements.

25. The apparatus of claim 17, further comprising separate retaining means for retaining said wafer carrier in said deposition position.

26. The apparatus of claim 25, wherein said retaining means are integral with said upper end of said spindle.

27. The apparatus of claim 17, further comprising mechanical means for transporting said wafer carrier between said deposition position and said loading position.

28. The apparatus of claim 17, wherein said loading position is located outside said reaction chamber.

29. The apparatus of claim 17, wherein said wafer carrier supports and transports a plurality of wafers.

* * * * *